(12) United States Patent
Haruta et al.

(10) Patent No.: US 6,512,421 B1
(45) Date of Patent: Jan. 28, 2003

(54) GUNN DIODE OSCILLATOR WITH NRD GUIDE

(75) Inventors: Kazumasa Haruta, Nagaokakyo (JP); Sadao Yamashita, Kyoto (JP); Toru Tanizaki, Nagaokakyo (JP); Koichi Sakamoto, Otsu (JP)

(73) Assignee: Murata Manufacturing Co. Ltd (JP)

( * ) Notice: Subject to any disclaimer, the term of this patent is extended or adjusted under 35 U.S.C. 154(b) by 23 days.

(21) Appl. No.: 09/684,274

(22) Filed: Oct. 6, 2000

(30) Foreign Application Priority Data

Oct. 7, 1999 (JP) .......................................... 11-286653

(51) Int. Cl.⁷ .............................................. H03B 11/10
(52) U.S. Cl. .............. 331/107 G; 331/99; 331/107 SL; 331/117 D; 333/248
(58) Field of Search ............................ 331/99, 107 SL, 331/107 G, 117 D; 33/248

(56) References Cited

U.S. PATENT DOCUMENTS 5,920,245 A * 7/1999 Ishikawa et al. ........ 331/107 D

* cited by examiner

*Primary Examiner*—Arnold Kinkead
(74) *Attorney, Agent, or Firm*—Dickstein, Shapiro, Morin & Oshinsky, LLP.

(57) ABSTRACT

An oscillation circuit is constructed by providing a line and a Gunn diode on a dielectric substrate, and an oscillation signal as the fundamental frequency signal of an oscillator is injected into the Gunn diode through a DC bias line. By disposing a dielectric stripline between upper and lower conductor plates, at NRD guide as an output transmission line is constructed, and the line and the NRD guide are coupled. The cutoff frequency of the NRD guide is determined so that the fundamental wave component of oscillation signal of the oscillation circuit is cut off and a harmonic is propagated.

10 Claims, 3 Drawing Sheets

GUNN DIODE OSCILLATOR WITH NRD GUIDE

BACKGROUND OF THE INVENTION

1. Field of the Invention

The present invention relates to an oscillator for the microwave band or the millimeter wave band provided with an oscillation circuit using, for example, a Gunn diode and provided with an output transmission line to output an oscillation signal. The present invention also relates to radio equipment using the oscillator.

2. Description of the Related Art

Up to now, in oscillators for the microwave band and the millimeter wave band using a negative-resistance element such as a Gunn diode, etc., an injection-locking type oscillator has been used, as disclosed in-Japanese Unexamined Patent Application Publication No. 10-145143.

When such an oscillation circuit which performs multiplying oscillation is used, an oscillator for the millimeter wave band above, for example, the 60 GHz band, which cannot be directly oscillated by Gunn diodes, etc., can be constructed.

However, in the conventional oscillator disclosed in the above-mentioned publication, bandpass filters (BPFS) and high-pass filters (HPFS) are required in the output circuit to suppress the fundamental wave, and the circuit construction becomes complicated. Furthermore, because of such a circuit for suppressing the fundamental wave, there also arises the problem of increased loss of components of the frequency to be output.

SUMMARY OF THE INVENTION

Accordingly, it is an object of the present invention to provide an oscillator which solves the above-mentioned problems, which is appropriate for mass-production and cost reduction, and which also reduces the number of parts due to a simple construction, and to provide radio equipment using the oscillator.

Furthermore, it is another object of the present invention to provide an oscillator in which the fundamental wave is fully suppressed and which exhibits low loss, and to provide radio equipment using the oscillator.

In an oscillator of the present invention which comprises an oscillator circuit constructed on a dielectric substrate and an output transmission line for transmitting an oscillation output signal of the oscillation circuit, the output transmission line comprises a transmission line in which a portion of dielectric material is contained between two substantially parallel conductor surfaces and which has cutoff characteristics, a cutoff frequency of the transmission line being determined so that one of a fundamental wave component and a combination of the fundamental wave component and lower-order harmonic components are cut off and a higher-order harmonic which is higher than the components is propagated. The oscillation circuit is constructed by mounting a negative-resistance element in a line, and injecting means for injecting a signal of the frequency of the fundamental wave into a bias line for supplying a bias voltage to the negative resistance element is provided.

In an oscillator of the present invention the output transmission line comprises a dielectric line in which a dielectric stripline is disposed between the two substantially parallel conductor plates.

In an oscillator of the present invention, the negative-resistance element is connected to a line made of a conductor pattern formed on a dielectric substrate, the output transmission line is coupled to the line, and, when the wavelength on the line is denoted by $\lambda_g$, the length from the connecting location of the negative-resistance element to an the closest end portion is $\lambda_g/4+N_1\times\lambda_g/2$ where $N_1$ is an integer over zero, and the length from the connecting location of the negative-resistance element to the coupling location of the output transmission line is $\lambda_g/4+N_2\times\lambda_g/2$ where $N_2$ is an integer over zero.

In an oscillator of the present invention, the output line is a dielectric line in which a dielectric stripline is disposed between the substantially parallel conductor plates, and by forming a slot in one conductor plate and by disposing the dielectric substrate outside the conductor plate, the line of the oscillation circuit and the dielectric line are coupled.

In an oscillator of the present invention, the dielectric substrate is housed inside a case, a wide portion and a narrow portion are provided in the bias line, and in the vicinity of a narrow portion a spring for fixing the dielectric plate to the inside surface of the case is provided.

Radio equipment of the present invention is constructed by using any one of the above oscillators.

DESCRIPTION OF THE PREFERRED EMBODIMENTS

The construction of an oscillator according to a first embodiment is described below with reference to FIGS. 1A, 1B, 1C, and 2.

Figure 1A:
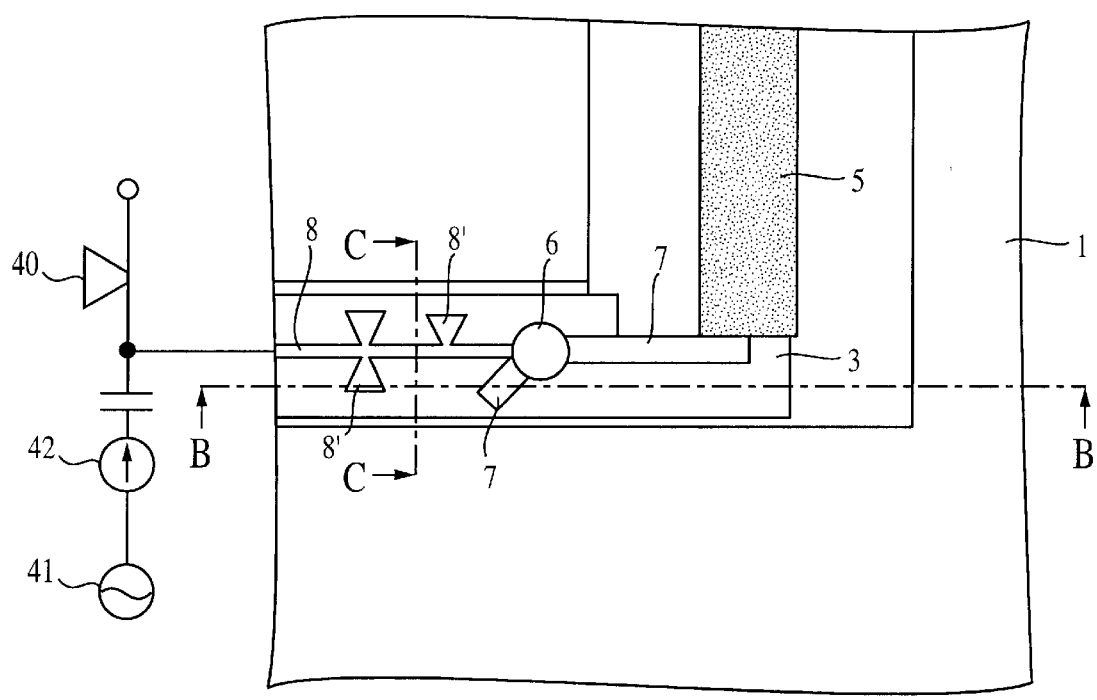
FIGS. 1A, 1B, and 1C show the construction of an oscillator according to a first embodiment.
Figure 1B:
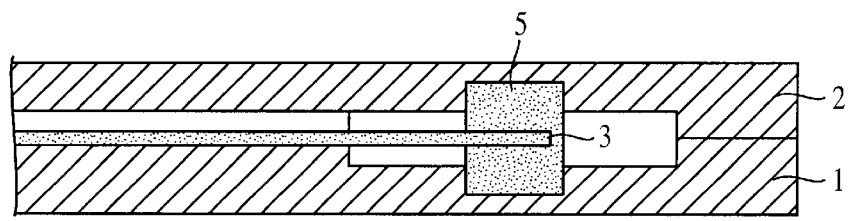
Figure 1C:
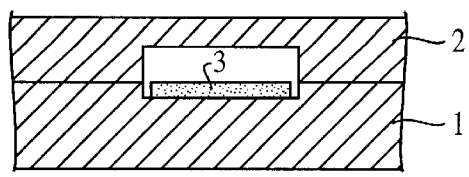

FIG. 1A is a top view of an oscillator having upper and lower conductor plates in which the upper conductor plate is removed, FIG. 1B is a sectional view taken along line B—B in FIG. 1A, and FIG. 1C is a sectional view taken along line C—C in FIG. 1A. In FIGS. 1A to 1C, a lower conductor plate 1 and an upper conductor plate 2 are shown, and inside a space sandwiched between these upper and lower conductor plates 1 and 2, an oscillator is constructed. A dielectric substrate 3 is shown in the drawings. A line 7 for an oscillation circuit is provided on the upper surface of the dielectric substrate 3, and a Gunn diode 6 is connected at a fixed location of the line. The Gunn diode 6 is of a pill package type and is mounted on the lower conductor plate 1, and a projected electrode of the Gunn diode is made to pass through a hole formed in the dielectric substrate 3 and is electrically connected to the line 7 by soldering, etc.

On the upper surface of the dielectric substrate 3, a bias line 8 for supplying a DC bias voltage to the above Gunn diode is formed, and stubs 8' are provided at fixed locations of the bias line 8.

Furthermore, in FIGS. 1A and 1B, a dielectric stripline 5 is shown, and by forming grooves having the same width as the dielectric stripline 5 at fixed locations of the upper and lower conductor plates 1 and 2, the dielectric stripline 5 is disposed along the grooves. By using the dielectric stripline 5 and the upper and lower conductor plates 1 and 2, a nonradiant dielectric line (hereinafter, called a "NRD guide") is constructed. Particularly, in this example, the distance between the upper and lower conductor plates 1 and 2 in the space on both sides of the dielectric stripline 5 is made smaller than the distance between the upper and lower conductor plates in the portion of the dielectric stripline 5, and accordingly the nonradiant dielectric line functions so that the propagation of an LSE01 mode is prevented and a single LSM mode is propagated.

In the dielectric substrate 3, the line 7 provided on the upper surface of the substrate 3 is disposed so as to be perpendicular to the axial direction of the dielectric stripline 5 and parallel to the upper and lower conductor plates and for the end of the line 7 to be positioned at the middle in the width direction of the dielectric stripline 5. Because of this, a suspended line mode by the line 7 and the upper and lower conductor plates and an LSM mode of the above dielectric line are magnetically coupled.

Furthermore, in FIG. 1A, an oscillator 41 to oscillate a signal of the fundamental frequency, an isolator 42, and a stub 40 as a trap for the fundamental frequency are shown. Because of this construction, the fundamental frequency signal is injected into the Gunn diode 6 through the isolator 42 and the bias line 8. At this time, as the fundamental frequency component is trapped by the stub 40, the oscillation signal from the oscillator 41 does not leak to the DC bias circuit.

Thus, by injecting a signal of the fundamental frequency into the Gun diode 6, the fundamental frequency wave and its harmonics oscillate.

Furthermore, stubs 8' shown in FIG. 1A are provided at locations which are multiples of about one quarter of the wavelength of a harmonic on the bias line away from the location where the Gun diode 6 is connected, that is, from the location of a nearly short-circuited point in an equivalent circuit of the bias line. Therefore, the impedance Z when the bias supply side is looked at from the Gunn diode 6 side shows a high impedance, and the stubs 8' function as a trap. Because of this, the oscillation signal does not leak to the DC bias circuit side through the bias line, and the oscillation efficiency is improved.

The above NRD guide exhibits a frequency cutoff characteristic, and the dielectric constant and dimensions of the dielectric stripline 5 and the dimensions of the space between the upper and lower conductor plates 1 and 2 are determined so that the cutoff frequency is made higher than the fundamental oscillation frequency by the Gunn diode 6 and lower than the frequency of the second harmonic (double-frequency wave). Therefore, in the NRD guide, only a harmonic component of the oscillation signal is transmitted. When, for example, the fundamental oscillation frequency of the Gunn diode is 38 GHz, the second harmonic of 76 GHz is transmitted into the NRD guide.

Furthermore, the third harmonic and higher-order harmonics are also transmitted, but generally, the output power of the harmonics of higher order is reduced, and accordingly the influence of the harmonics becomes negligible compared with that of the fundamental wave.

Figure 2:
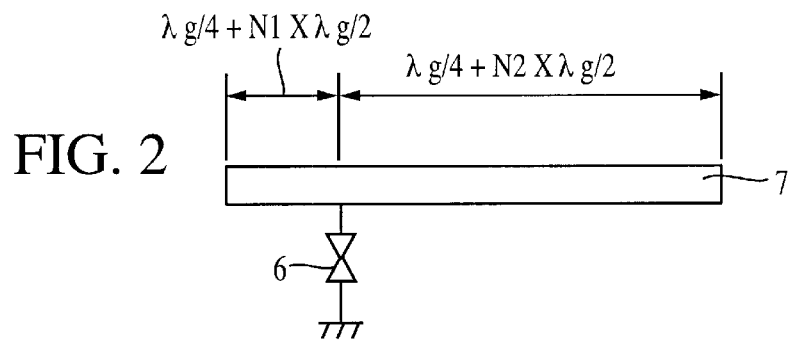
FIG. 2 shows the relationship between a line in a oscillation circuit and the connecting location of a Gunn diode, etc., in the oscillator in FIGS. 1A, 1B, and 1C

FIG. 2 is a circuit diagram showing the construction of a portion of the oscillation circuit shown in FIG. 1. Both ends of the line 7 are made open. When one wavelength on the line 7 is denoted by $\lambda_g$, as the impedance of the Gunn diode 6 is as low as a few ohms, impedance matching is made by connecting the Gunn diode 6 at a location $\lambda_g/4+N_1\times\lambda_g/2$ from one open end of the line 7 and at a location $\lambda_g/4+N_2\times\lambda_g/2$ from the other end of the line 7, that is, a substantially short-circuited point in an equivalent circuit of the line.

Because of the above construction, the component of the second harmonic of a signal synchronized with the fundamental frequency is transmitted as an output signal through the NRD guide.

Figure 3:
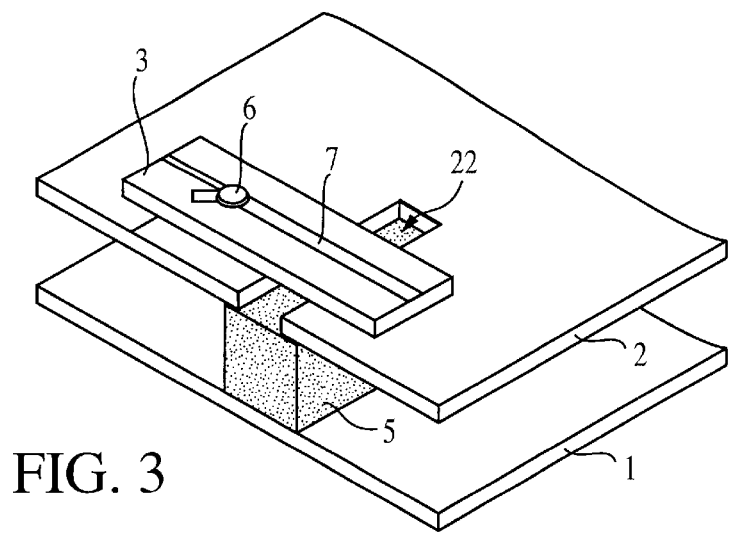
FIG. 3 is a perspective view showing the construction of an oscillator according to a second embodiment.

Next, the construction of an oscillator according to a second embodiment is described with reference to FIG. 3.

In the first embodiment, the dielectric substrate 3 was provided within the space sandwiched between the upper and lower conductor plates 1 and 2, but in the second embodiment the dielectric substrate 3 is disposed outside the upper and lower conductor plates 1 and 2. That is, in the upper conductor plate 2, a slot 22 is formed in the longitudinal direction of a dielectric stripline 5, and the dielectric substrate 3 is disposed so that the line 7 for the oscillation circuit is perpendicular to the slot 22. The construction of the dielectric substrate 3 is basically the same as that shown in FIG. 1. However, a microstrip-line mode (that is, a TEM mode) propagated on the line 7 of the oscillation circuit and a dielectric-line LSM mode are electromagnetically coupled through the slot 22. At this time, the magnetic field of the TEM mode spreads through the slot, but the magnetic field of the LSM mode does not leak from the slot 22 at the side of the dielectric substrate 3. Therefore, unidirectional coupling takes place from the line 7 to the NRD guide. Because of such a construction, even if the reflected wave at the discontinuity portion in the NRD guide returns to the side of the Gunn diode, the signal level is suppressed. Moreover, because the NRD guide does not propagate the fundamental wave component, the component is not included in the signal which returns to the side of the Gunn diode. Therefore, the influence on the oscillation characteristics is small.

Next, the construction of an oscillator according to a third embodiment is described with reference to FIGS. 4A and 4B.

Figure 4A:
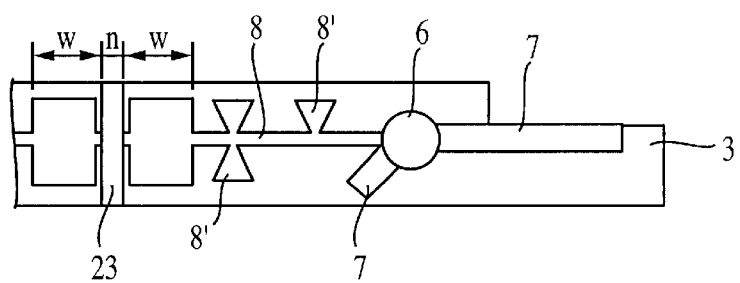
FIGS. 4A and 4B show the construction of an oscillator according to a third embodiment.
Figure 4B:
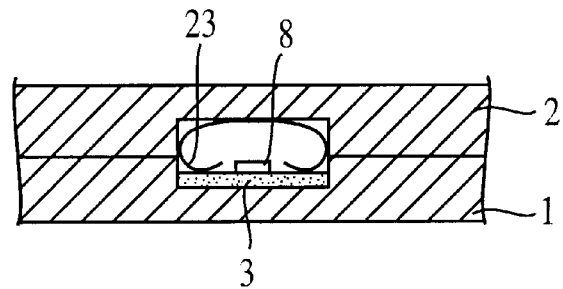

FIG. 4A is a top view of the portion of an oscillation circuit in which an upper conductor plate is removed, and FIG. 4B is a sectional view at a plane perpendicular to a bias line in which the upper conductor plate is provided. In this example, a bias line 8 is made to have the characteristics of a low-pass filter to cut off components of an oscillation signal by forming repeated patterns of a wide portion and a narrow portion in the bias line. Then, a pressure spring 23 is provided in a narrow portion indicated by n. This pressure spring presses a dielectric substrate 3 against a lower conductor plate 1 in a space between the dielectric substrate 3 and an upper conductor plate 2, such that the dielectric substrate 3 is disposed inside the space produced between the upper and lower conductor plates 1 and 2. Therefore, even if the dielectric substrate 3 is slightly warped, the dielectric substrate 3 is securely fixed inside the space produced by the upper and lower conductor plates 1 and 2 and stable frequency characteristics can be obtained.

Moreover, because the pressure spring is provided in the narrow portion of the bias line, the pressure spring is not connected to the bias line, and as this portion EVE functions as an inductor in the equivalent circuit, this portion has little influence on the bias line.

Next, as an embodiment of radio equipment, an example of the construction of a millimeter wave radar is explained with reference to FIG. 5.

Figure 5:
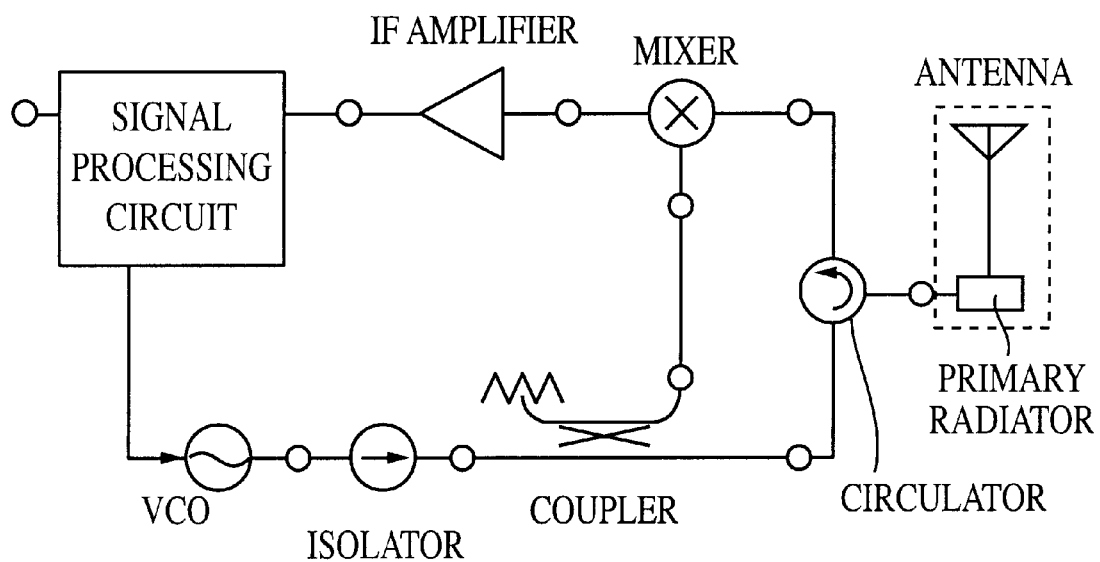
FIG. 5 is a block diagram showing the construction of a millimeter wave radar according to a fourth embodiment.

In a VCO (voltage-controlled oscillator) in FIG. 5, by making the oscillator 41 in the oscillator shown in the first embodiment a voltage-controlled oscillator, the oscillation frequency of the Gunn diode synchronized to the signal of the frequency of the oscillator 41 is made variable. An oscillation signal which is frequency modulated by a triangular wave signal, for example, given by a signal processing circuit is output. The output of the oscillation signal is transmitted to a primary radiator through an isolator, a coupler, and a circulator. In this way, a millimeter wave signal of a fixed beam width is transmitted by the primary radiator through a dielectric lens, etc. Part of the transmission signal is supplied to a mixer by a coupler as a local signal. When a reflected wave from an object enters the primary radiator, the reception signal is supplied to the mixer through a circulator. The mixer mixes the reception signal from the circulator and the above-mentioned local signal to produce an intermediate-frequency signal. An IF amplifier amplifies this intermediate-frequency signal and supplies the signal to the signal processing circuit. The signal processing circuit detects the distance to the object and the relative speed of the object based on the modulated signal supplied to the VCO and the IF signal.

A Gunn diode of a pill package type was described in the embodiments, but a surface-mounting-type Gunn diode may be mounted on the dielectric substrate. Furthermore, as a negative-resistance element, a three-terminal element other than a Gunn diode such as an FET, etc., may be used. When a MOS-FET, for example, is used, a line for coupling with the NRD guide is connected to the drain, a resonance line is connected to the source, and a bias line-is connected to the gate.

Furthermore, in the embodiments, by using a Gunn diode with a fundamental wave of 38 GHz, an oscillation signal of 76 GHz as the second harmonic is provided, but in order that the component of a higher order harmonic, a third harmonic or higher, is transmitted to the output transmission liner the cutoff frequency may be set between the second harmonic and the third harmonic.

Moreover, in the embodiments, by making the line 7 in the oscillation circuit provided on the dielectric substrate 3 close to the end portion of the dielectric stripline 5, coupling was established between the lines, but by dividing the dielectric stripline into upper and lower parts by a plane which is parallel to the upper and lower conductor plates and by disposing a dielectric substrate between the upper and lower parts of the dielectric stripline, coupling may be established between the line of the oscillator circuit and the NRD guide.

According to an aspect of the present invention, a high-frequency signal which is difficult to directly oscillate can be easily obtained, and furthermore, as a line for supplying a bias voltage is also used for injecting the fundamental wave signal to generate synchronous oscillation, the whole construction of the oscillator is simplified and the number of parts decreases. Therefore, the oscillator is appropriate for mass-production and has a low cost. Furthermore, the fundamental wave component and lower-order harmonics are securely cut off in the output transmission line, and as only a harmonic component for use is transmitted, the signal of the harmonic to be utilized does not become attenuated.

According to the invention, as the structure for coupling between a line formed on a dielectric substrate and an output transmission line is simplified, smaller oscillators can be provided.

According to the invention, impedance matching of a negative-resistance element having low impedance such as a Gunn diode, etc., with a line can be easily achieved, and therefore output power can be increased.

According to the invention, because a signal returning from a dielectric line to an oscillation circuit is suppressed and moreover the fundamental frequency signal does not return, stable oscillation characteristics can be obtained.

According to the invention, variations in characteristics due to the deformation of a dielectric substrate are suppressed, and therefore stable characteristics can be obtained.

According to the invention, a millimeter wave radar, etc., which is compact and which exhibits low loss and high gain can be obtained.

While the invention has been particularly shown and described with reference to preferred embodiments, it will be understood by those skilled in the art that the foregoing and other changes in form and details can be made without departing from the spirit and scope of the invention.

What is claimed is:

1. An oscillator comprising:

an oscillation circuit constructed on a dielectric substrate; and an output transmission line for transmitting an oscillation output signal of the oscillation circuit, wherein the output transmission line comprises a transmission line in which a portion of dielectric material is contained between two substantially parallel conductor plates and which has cutoff characteristics, a cutoff frequency of the transmission line being determined so that one of a fundamental wave component and a combination of the fundamental wave component and lower-order harmonic components are cut off and a higher-order harmonic which is higher than said cut-off components is propagated, and wherein the oscillation circuit comprises a negative-resistance element, and an injecting circuit for injecting a signal of the frequency of the fundamental wave into a bias line for supplying a bias voltage to the negative-resistance element.

2. An oscillator as claimed in claim 1, wherein the output transmission line comprises a dielectric line in which a dielectric stripline is disposed between the two substantially parallel conductor plates.

3. An oscillator comprising:

an oscillation circuit constructed on a dielectric substrate; and an output transmission line for transmitting an oscillation output signal of the oscillation circuit, wherein the output transmission line comprises a transmission line in which a portion of dielectric material is contained between two substantially parallel conductor surfaces and which has cutoff characteristics, a cutoff frequency of the transmission line being determined so that one of a fundamental wave component and a combination of the fundamental wave component and lower-order harmonic components are cut off and a higher-order harmonic which is higher than said cut-off components is propagated;

wherein the oscillation circuit comprises a negative-resistance element, and an injecting circuit for injecting a signal of the frequency of the fundamental wave into a bias line for supplying a bias voltage to the negative-resistance element;

wherein the output transmission line comprises a dielectric line in which a dielectric stripline is disposed between the two substantially parallel conductor plates, and wherein in the oscillation circuit, the negative-resistance element is connected to a line made of a conductor pattern formed on the dielectric substrate and the output transmission line is coupled to the line, and wherein, when the wavelength on the line is denoted by $\lambda_g$, the length from the connecting location of the negative-resistance element to an open end of the line is $\lambda_g/4 + N_1 \times \lambda_g/2$ where $N_1$ is an integer over zero, and the length from the connecting location of the negative-resistance element to the coupling location of the output transmission line is $\lambda_g/4 + N_2 \times \lambda_g/2$ where $N_2$ is an integer over zero.

4. An oscillator comprising:

an oscillation circuit constructed on a dielectric substrate; and an output transmission line for transmitting an oscillation output signal of the oscillation circuit, wherein the output transmission line comprises a transmission line in which a portion of dielectric material is contained between two substantially parallel conductor surfaces and which has cutoff characteristics, a cutoff frequency of the transmission line being determined so that one of a fundamental wave component and a combination of the fundamental wave component and lower-order harmonic components are cut off and a higher-order harmonic which is higher than said cut-off components is propagated;

wherein the oscillation circuit comprises a negative-resistance element, and an injecting circuit for injecting a signal of the frequency of the fundamental wave into a bias line for supplying a bias voltage to the negative-resistance element; and wherein in the oscillation circuit, the negative-resistance element is connected to a line made of a conductor pattern formed on the dielectric substrate and the output transmission line is coupled to the line, and wherein, when the wavelength on the line is denoted by $\lambda_g$, the length from the connecting location of the negative-resistance element to an open end of the line is $\lambda_g/4 + N_1 \times \lambda_g/2$ where $N_1$ is an integer over zero, and the length from the connecting location of the negative-resistance element to the coupling location of the output transmission line is $\lambda_g/4 + N_2 \times \lambda_g/2$ where $N_2$ is an integer over zero.

5. Radio equipment comprising a high-frequency circuit including at least one of a transmitting circuit and a receiving circuit, said high-frequency circuit comprising an oscillator as claimed in any one of claims 1, 2, 3 and 4.

6. An oscillator as claimed in claim any one of claims 1, 2, 3 and 4, wherein a slot is formed in one conductor plate of the two substantially parallel conductor plates, the dielectric substrate is disposed outside the conductor plate, and a line of the oscillation circuit and the dielectric line are coupled.

7. An oscillator as claimed in any one of claims 1, 2, 3, and 4, wherein the dielectric substrate is housed inside a case, a wide portion and a narrow portion are provided in the bias line, and in the vicinity of the narrow portion, a spring for fixing the dielectric substrate to the inner surface of the case is provided.

8. An oscillator as claimed in claim 6, wherein the dielectric substrate is housed inside a case, a wide portion and a narrow portion are provided in the bias line, and in the vicinity of the narrow portion, a spring for fixing the dielectric substrate to the inner surface of the case is provided.

9. Radio equipment comprising a high-frequency circuit including at least one of a transmitting circuit and a receiving circuit, said high-frequency circuit comprising an oscillator as claimed in claim 6.

10. Radio equipment comprising a high-frequency circuit including at least one of a transmitting circuit and a receiving circuit, said high-frequency circuit comprising an oscillator as claimed in claim 7.

* * * * *